United States Patent [19]

Ehrmann-Falkenau et al.

[11] Patent Number: 4,673,901
[45] Date of Patent: Jun. 16, 1987

[54] ELECTRICAL FILTER OPERATING WITH ACOUSTIC WAVES

[75] Inventors: Ekkehard Ehrmann-Falkenau, Munich; Richard Veith, Unterhaching; Wolfgang Till, Munich, all of Fed. Rep. of Germany

[73] Assignee: Siemens Aktiengesellschaft, Berlin and Munich, Fed. Rep. of Germany

[21] Appl. No.: 788,877

[22] Filed: Oct. 18, 1985

[30] Foreign Application Priority Data

Oct. 26, 1984 [DE] Fed. Rep. of Germany ....... 3439340
Jul. 11, 1985 [DE] Fed. Rep. of Germany ....... 3524825

[51] Int. Cl.$^4$ .............................................. H03H 9/64
[52] U.S. Cl. ................................. 333/196; 310/313 C
[58] Field of Search .................................. 333/150-155, 333/193-196; 310/313 R, 313 A, 313 B, 313 C, 313 D

[56] References Cited

U.S. PATENT DOCUMENTS 4,066,985  1/1978  Kuny .............................. 333/196 X
4,205,285  5/1980  Dempsey et al. ............... 310/313 C

OTHER PUBLICATIONS

Ehrmann-Falkenau et al.-"A Design for Saw-Filters with Multistrip Couplers", 1984 Ultrasonics Symposium; pp. 13-17.

Primary Examiner—Paul Gensler
Attorney, Agent, or Firm—Hill, Van Santen, Steadman & Simpson

[57] ABSTRACT

A surface wave filter having an interdigital structure in which last active fingers of a first comb structure, which is to be connected to ground, extend as close as possible to a busbar of an opposite comb structure. Interference signals based on the discontinuity of the end of the interdigital structure are eliminated.

9 Claims, 7 Drawing Figures

ELECTRICAL FILTER OPERATING WITH ACOUSTIC WAVES

BACKGROUND OF THE INVENTION

The present invention relates to a filter for operation with acoustic waves.

In electrical technology it is known to use filters which operate with elastic, acoustic waves. These consist, in particular, of surface wave filters. Filters of this kind are described in general terms in Mathews "Surface Wave Filters", J. Wiley & Sons, New York, incorporated herein by reference.

A filter of this kind is constructed on a preferably piezo-electric substrate. It has at least one input transducer, at least one output transducer, and possibly additional structures, such as in particular reflector structures. Reflector structures of this kind are used in particular for resonator filters, in which, in particular, the input transducer and the output transducer can also represent one and the same transducer. In order to achieve a specific, predetermined transformation characteristic and a specific, predetermined resonance characteristic, it is known to weight the transducers, which are designed as interdigital structures, i.e. to provide the transducers with a finger weighting (finger-length weighting, finger position weighting, or omission weighting). A transducer such as that used in the present invention normally consists of an interdigital structure composed of two interlocking combs. Such a comb consists of fingers which are arranged parallel to one another and which, in the case of a transducer, are electrically connected by means of a busbar. As is known, finger-length weighting comprises a greater or lesser overlap between adjacent fingers. One of these fingers is assigned to the first comb and the other finger is assigned to the other comb. Arrangements comprising split fingers are similar. The length dimension of the mutual overlap between two adjacent fingers of this kind is a gauge of the electro-acoustic efficiency of this pair of fingers. Adjacent fingers, of which one is assigned to the first comb and the other to the other comb, are spaced from one another by intervals on the order of half a wavelength of the elastic, acoustic wave which is to be produced.

FIG. 1 shows a filter 1 with three transducers arranged on a substrate 2. For example, the transducer 3 arranged in the center represents the input transducer, and the two outer transducers 4 and 5 represent output transducers, possibly connected in parallel. In the substrate 2, elastic waves produced by the input transducer 3 pass in the main propagation directions 6 and 7 of these waves to the output transducers 4 and 5.

The acoustic waves in question include surface waves in a narrow sense (Rayleigh-Waves; Bleustein-Waves), transverse and shearing waves running close to the surface (such as surface skimming bulk waves), and also components running close to the surface of (longitudinally polarized) volume waves. In the following description, these types of waves will be referred to as surface waves (to be understood in a more general sense). The type of wave which will be produced in a particular situation will depend upon the techniques, known to those skilled in the art, relating to the dimensioning of the transducers, and possibly also upon anisotropic properties of the substrate.

FIG. 1 illustrates the transducers, in particular the input transducer, from which a generated acoustic wave is transmitted, and having side edges 8, 9 which are parallel to one another. These side edges are busbars aligned parallel to one another, and a correspondingly constant width of the transducer surface. Across the entire transducer, this constant width results in a constant length dimensioning for the arrangement of the fingers. Such a design of a transducer has the advantage that the waves emanating therefrom do not collide with busbars extending into the path of propagation, which is a disadvantage of transducers comprising convergent busbars.

A wave which is generated in the input transducer 3 and transmitted from the transducer 3 in accordance with the main propagation direction 6 and 7 is subject to disturbances even when the design of the interdigital structure of the transducer is precise. These disturbances are based on a discontinuity effect governed by the fact that the wave which is produced in the transducer and is transmitted therefrom leaves the transducer at its end and passes into a free portion of the substrate. An abrupt transition occurs between the structure of the transducer and the free surface of the substrate.

For many years it has been known (e.g. from the Japanese Patent application No. 56-122215A, incorporated herein by reference), to eliminate such disturbances by employing a technique whereby the transducer is equipped at the end in question with fingers which become shorter in stepped fashion so that the end in question of the transducer has a stepped termination. The efficiency of this technique is fundamentally dependent upon the fineness of the steps, but in practice cannot result in a complete elimination of the discontinuity effect. In particular this technique has the disadvantage that it operates only in an extreme frequency selective manner.

SUMMARY OF THE INVENTION

An object of the present invention is to provide a new technique which replaces the above described technique, and by means of which the influence of the described discontinuity effect can be eliminated, and in particular eliminated over a wide band.

This object is achieved by providing in a transducer according to the invention a finger overlap structure defined by a serpentine curve wherein the end of the curve terminates relatively close to one of the busbars which has a high potential connected thereto. At the opposite ends of the transducer, a last of the overlapping fingers extends from the comb structure connected to a reference potential. Accordingly, both of these end last fingers are active and extend such that their ends are relatively close to the busbar of the opposite comb structure connected to the high potential.

The construction according to the invention is based upon a principle which differs entirely from the above described prior art, and which is based upon novel insight.

For explaining the invention, details will be given in the following relating to the construction, construction variations, and dimensioning of transducers of the type in question.

DESCRIPTION OF THE PREFERRED EMBODIMENTS

Figure 1:
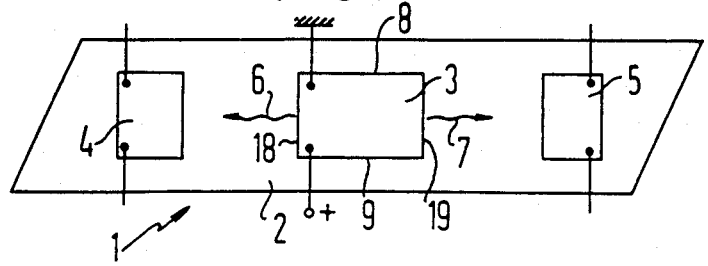
FIG. 1 illustrates a general arrangement of a filter of known type in which the invention is to be used, for example.
Figure 2:
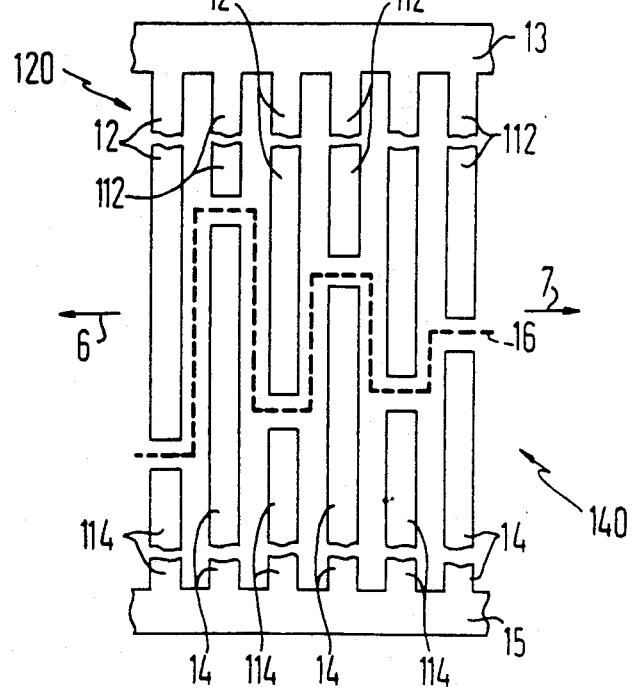
FIG. 2 shows a section of an interdigital structure of a transducer, fundamentally representing and for explaining finger overlap.

As a section of the interdigital structure of a transducer, FIG. 2 represents fingers 12 of the first comb 120 and fingers 14 of the other comb 140. The fingers 12 are connected to the one busbar 13, whereas the fingers 14 are connected to the other busbar 15. The mean distance between a finger 12 and a finger 14 amounts, according to the design, to ½ lambda or ¼ lambda of the acoustic wave length. A serpentine curve is referenced 16, the path of which extends (in FIG. 2) in a vertical direction along and between the overlap lengths of two adjacent fingers 12 (of the first comb) and 14 (of the other comb). In this context "overlap length" means the distance by which the long adjacent fingers run laterally next to one another. In the horizontal direction this serpentine curve passes between finger ends 12, 114 and 14, 112 arranged opposite one another. The fingers 112 and 114 are dummy fingers. Since they are located between two fingers of equal polarity, these dummy fingers are electrically inactive, but are used to equalize the structure.

Figure 3:
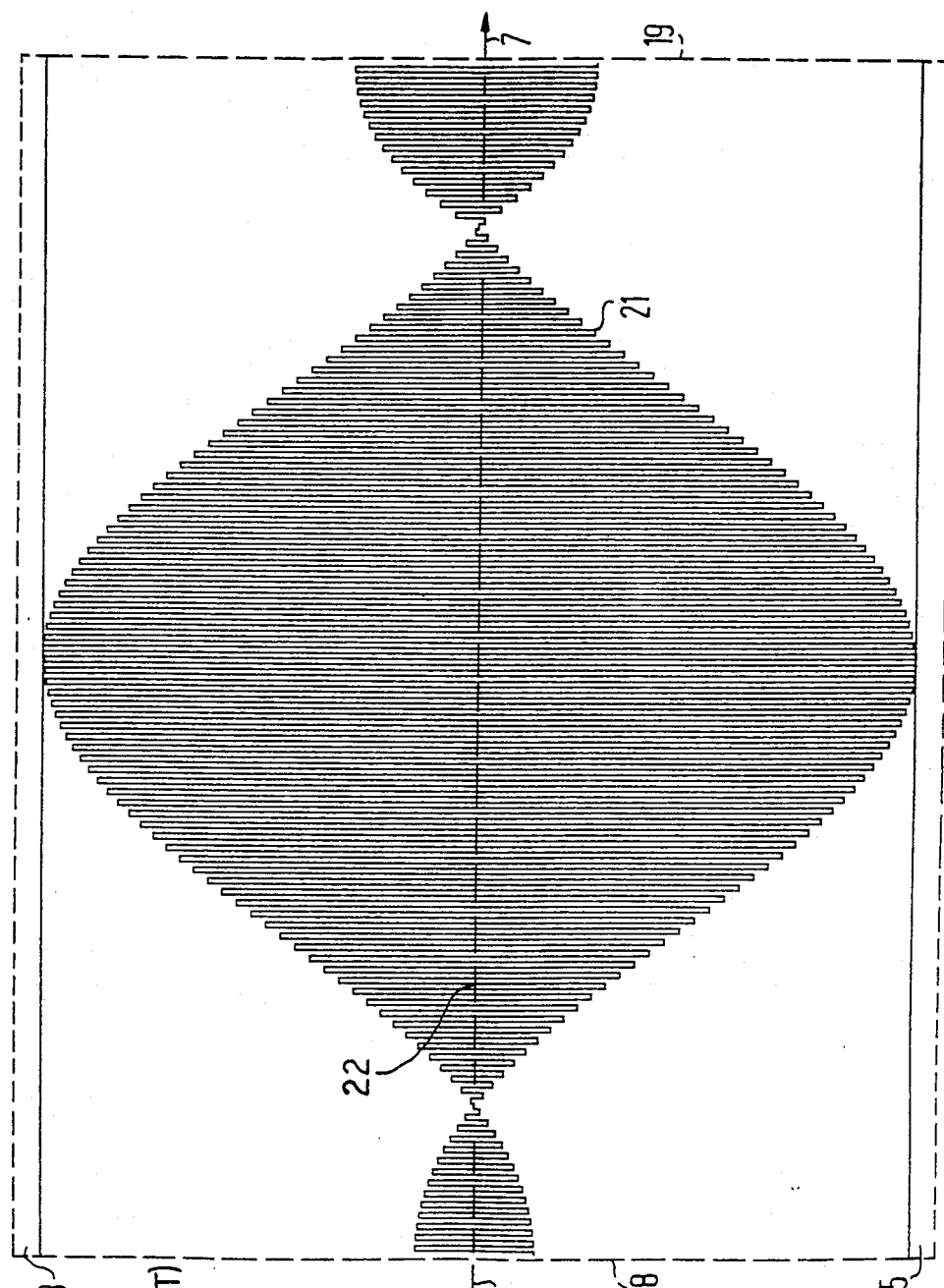
FIGS. 3 and 4 illustrate serpentine curves of known embodiments of an overlap weighting (Proc. IEEE, Ultrason. Symp. 14–16 Nov. 1984, p. 13–15, FIG. 7, 8, incorporated herein by reference)

FIG. 3 represents the corresponding serpentine curve 21 for a transducer of known type. The representation of the structure in the form of a serpentine curve 21 represents a very clear picture of the finger weighting of the entire transducer. The finger weighting, which in fact represents finger-length weighting, corresponds to the given transformation function of the transducer 3. In the case of a transducer governed by the serpentine curve 21, the center or center of gravity of the overlaps is located on the central line 22 between the amplitudes of the serpentine curve 21.

As can be seen, on the right and left of the area of center of gravity, this transducer structure contains zero points, i.e. points where adjacent fingers 12 and 14 have no or only very small overlap lengths. The illustrated example of a transducer represents longer overlaps at the ends 18, 19 in question, i.e. larger amplitudes of the serpentine curve 21, located in an area of approximately equal distance from the two busbars 13, 15.

Figure 4:
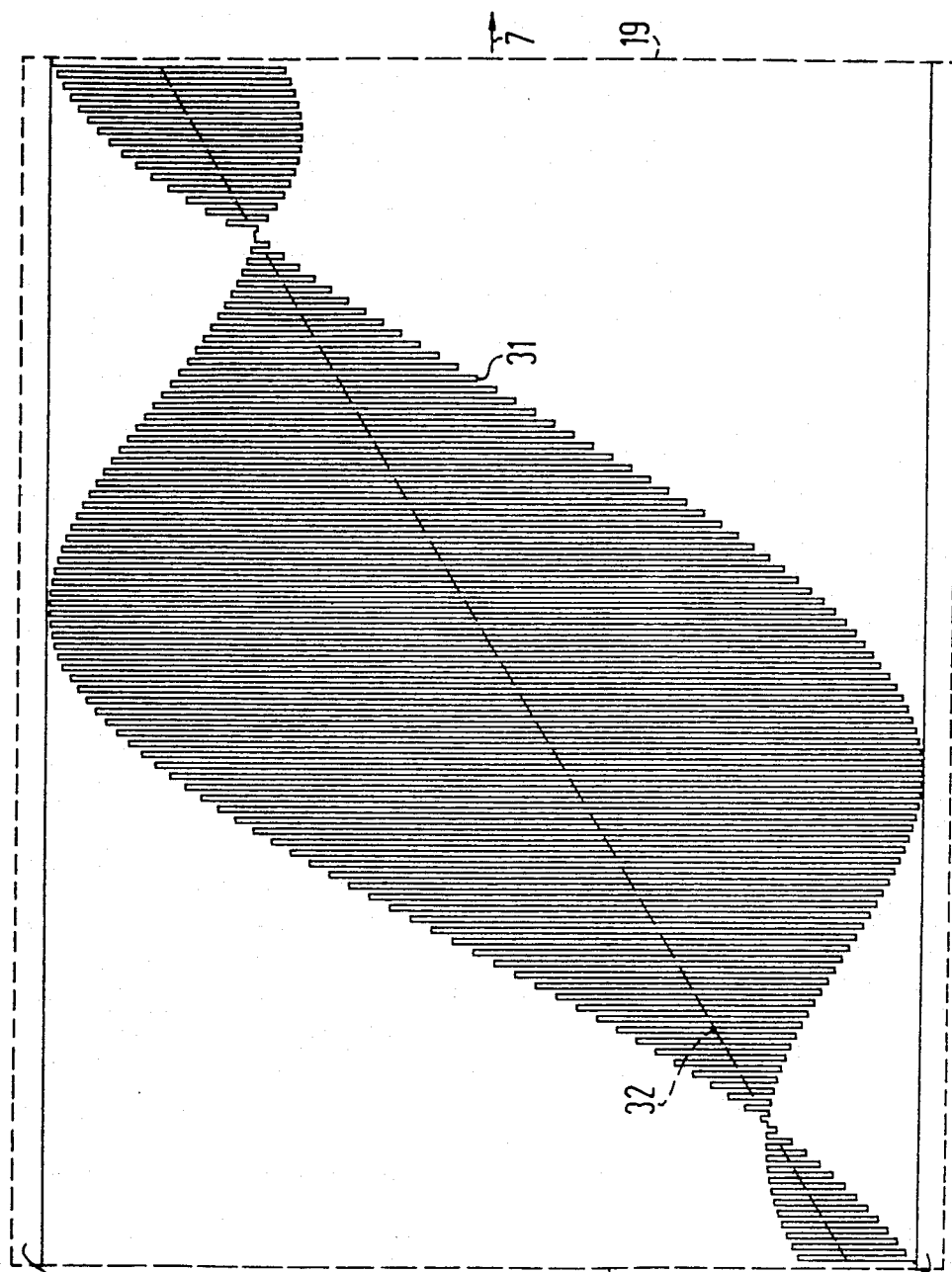

FIG. 4 represents a modification—already in use for many years—of the distribution of the finger weighting. The serpentine curve 31 in FIG. 4 fulfills (possibly except for fine detail) the transformation function on which the serpentine curve 21 is also based. As can be seen, however, the serpentine curve 31 corresponds to a finger overlap distribution whose center passes diagonally through the transducer. This central line has been referenced 32. At the one end 18 the amplitudes of the serpentine curve 31 are close to the one busbar 15, but at the other end 19 they are close to the other busbar 13.

The techniques corresponding to the difference between FIG. 4 and FIG. 3 serve to counteract disturbances of the wave propagation in the transducer. In the case of the transducer corresponding to the serpentine curve 21, the waves produced in the transducer run in the region of the overlap ends of all the finger pairs. In the case of the transducer governed by the serpentine curve 31, the overlap ends are offset relative to one another in such manner that the wave excitation produced by a pair of fingers or the wave component thereof reaches, and need pass through, only a considerably smaller number of finger pairs of the transducer.

A common feature of the embodiments represented in FIGS. 3 and 4 is that both of these have the disturbances which are to be eliminated according to the invention, and which in the prior art have been effectively eliminated only in part and/or only selectively by the technique (such as that described in the Japanese Patent Application) of arranging fingers which become shorter in stepped fashion at the end in question of the transducer.

Figure 5:
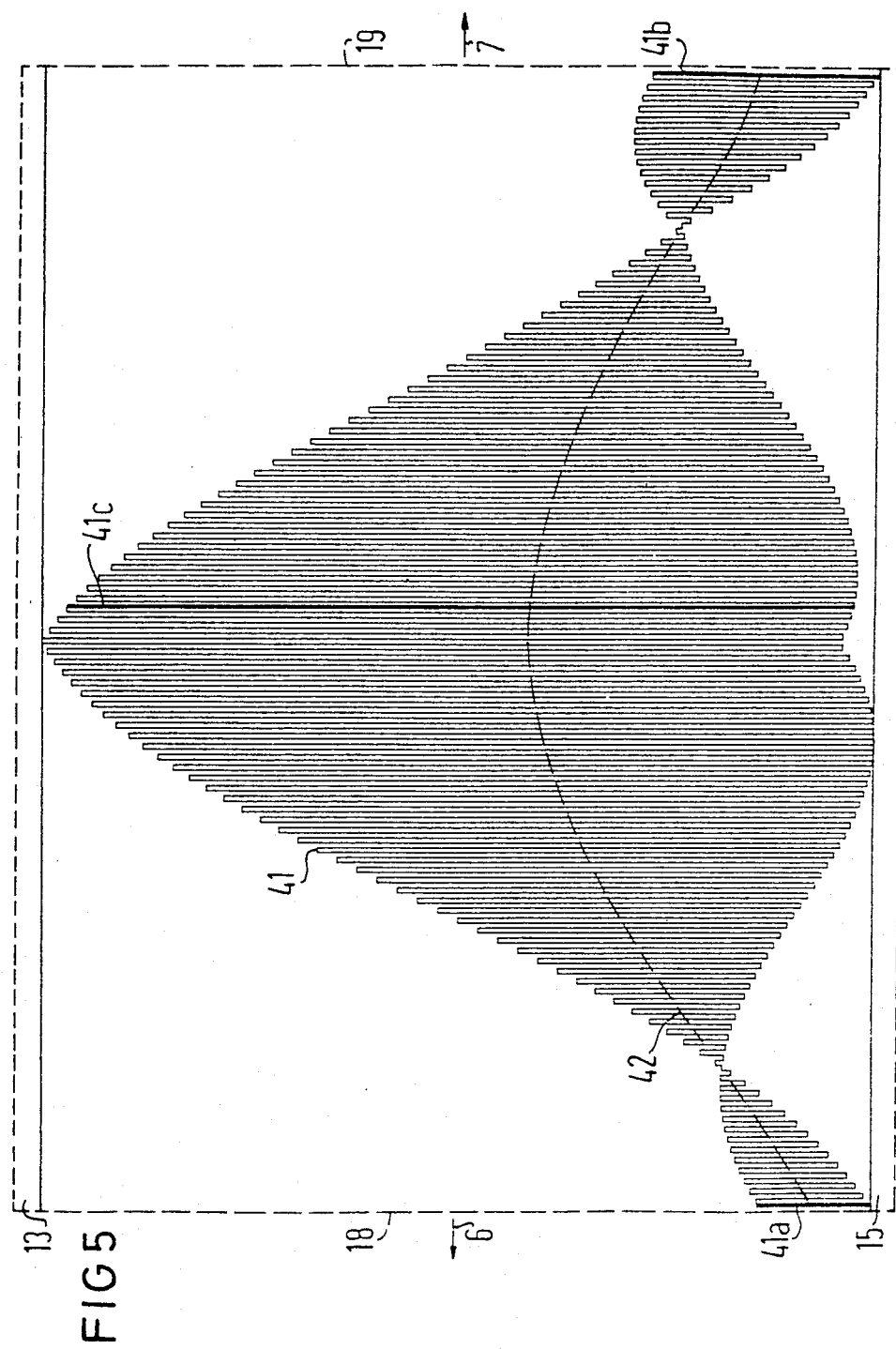
FIG. 5 shows the serpentine curve of a corresponding overlap weighting in accordance with the invention.

Surprisingly it has been established that in a transducer which—with an identical transformation function—has a finger overlap weighting which corresponds to the serpentine curve 41 represented in FIG. 5, the above described object can be fulfilled if it is also provided that the last finger of the structure, which lies at the end 18 and 19 in question of the transducer, is connected to the ground potential of the electrically asymmetrical signal which is fed to the transducer. Accordingly, the transducer in accordance with the invention is a transducer which is to be operated asymmetrically, and which represents the predominating mode of operation of such transducers.

As can be seen, in a transducer in accordance with the invention (FIG. 5 and 6), at both ends 18, 19 of the transducer, the serpentine curve 41, 141 tends in accordance with the invention towards one and the same busbar, namely the busbar 15 which is arranged opposite the busbar 13 connected to ground.

Figure 6:
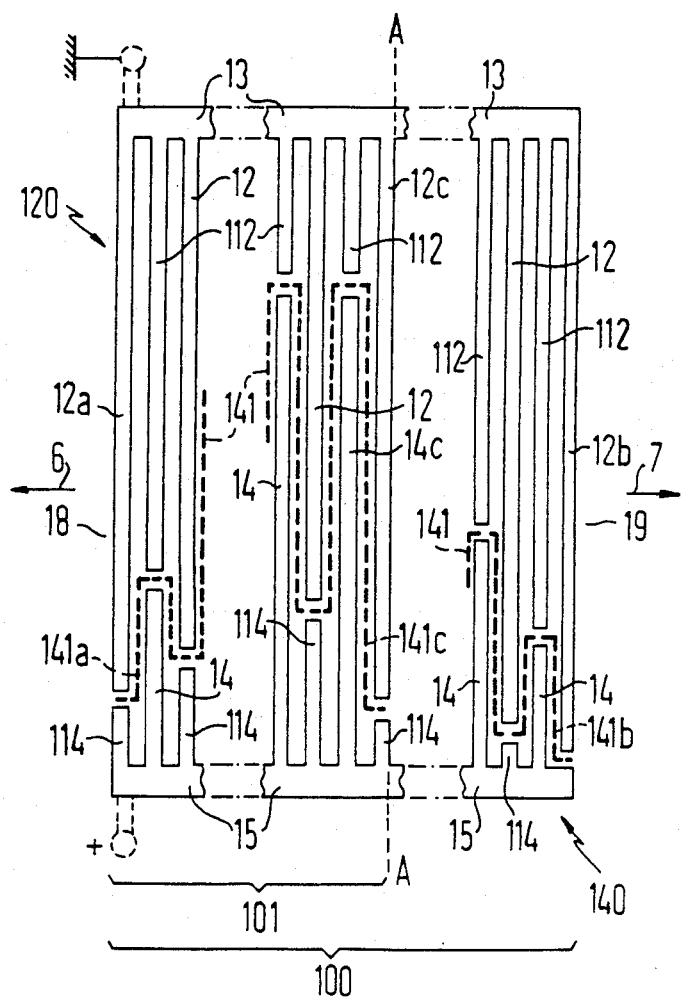
FIG. 6 illustrates an embodiment of the invention.

At its two ends 18, 19, a transducer 100 in accordance with the invention which corresponds to the serpentine curve 41 has overlapping (active) fingers 12a and 12b respectively which are connected to the busbar 13 which is itself connected to ground, where the overlap length can also approach zero. In the case of the transducer 100, each of these two fingers 12a and 12b which are connected to ground extend from the busbar 13 to as close as possible to the opposite busbar 15 (which is not connected to ground potential) of the comb 140 of the fingers 14, 114. Dummy fingers 114, which are possibly arranged opposite the last fingers 12a, 12b are of zero length or are kept as short as possible as shown in FIG. 6. These techniques can be implemented by an appropriate selection of the design for a transducer 100 in accordance with the invention. A transducer 100 in accordance with the invention employs the full width existing between the parallel busbars 13, 15, i.e. has no reduction in its aperture and no disturbances which are due to busbars which would otherwise extend into the propagation path of the transmitted wave.

In FIG. 5, namely the diagram of the serpentine curve 41, this specification of the invention which relates to the fingers 12a and 12b corresponds to the fact that the two ends 41a and 41b (emphasized by thicker lines) of the serpentine curve 41 extend to the busbar 15 which is not to be connected to ground. This also applies to the transducer 100 in the embodiment represented in FIG. 6, with respect to the ends 141a and 141b of the serpentine curve 141 of this example. The extent to which the last fingers 12a and 12b of the comb 120, connected to ground, approach the opposite busbar 15 of the comb 140, can be seen clearly from FIG. 6.

FIG. 6 contains another variation in which the transducer 101 is to extend only to the line A. In the case of the transducer 101, the active finger 12c has a comparatively very large overlap length, i.e. on this side the transducer 101 terminates with a large overlap of the fingers 12c and 14. The conditions of the invention are also fulfilled in the case of the transducer 101 at both of its ends. A variation corresponding to the (shortened) transducer 101 has been shown in FIG. 5, in which the correspondingly shortened transducer terminates on the right-hand side, as assumed, with the line 41c of the serpentine curve 41. The long length of the line 41c corresponds to a large overlap (at the end in question of this correspondingly shortened transducer), and yet the serpentine curve which is terminated by the line 41c again ends at the busbar 15.

It has been established that this design of a transducer in accordance with the invention produces an optimum result. However, a very good result is also obtained with a design in which, at that end of the transducer which is of significance for the application of the invention, the last finger 12a, 12b of the comb which is connected to ground occupies at least approximately 80% of the total possible finger length, i.e. of the width of the transducer in question, and the opposite dummy finger 114 of the opposite comb (i.e. of the busbar 15) occupies no more than the remaining 20%. Preferably the length of the last finger 12a, 12b, or 12c is to occupy at least 90% of the maximum width of the transducer, measured between the busbars 13, 15.

The invention results in a wide-band elimination of the disturbances which are to be eliminated in accordance with the invention. The result obtained by the invention is surprising, and the underlying physical effect has not previously been able to be satisfactorily explained and interpreted. It is confusing that, even in a transducer in accordance with the invention, the last finger—in contrast to the above described use corresponding, for example, to the previously mentioned Japanese Patent publication, is a full-length finger which is then followed by free substrate portions for the acoustic, i.e. mechanical wave travelling on, or in, the substrate. A particular advantage of the invention is that, apart from the requirement of converting the filter structure or the design in order to retain the same predetermined transformation function, no additional technological expense is necessary for its construction. In the invention, the area of the comb structure 140 of the busbar 15 is particularly small.

It should be expressly noted that the invention is in no way limited to transformation functions with minima, and in particular zero transitions, of the finger overlap within the structure. The invention can also be put into practice in the case of transducers corresponding to the predetermined transformation function, which for example have zero transitions of the finger overlap at one or at both ends, have no zero transitions at all, have a serpentine curve which converges only in the one or in the other direction, and the like. For the invention it is unnecessary that the constructed interdigital structure should be designed with a convergence of the busbars to one or to both ends of the transducer in question, such as was frequently the case, for example, in the initial phases of the development of such filters. As already described above, embodiments of this kind are disadvantageous.

The invention can also be employed in a corresponding manner in split finger structures.

The invention is provided for transducer structures which are weighted by finger lengths, and in which neither of the two transducer combs 120, 140 individually has only equal length active (overlapping) fingers (12, 14) (and both the combs are length-weighted). With a structure of this kind, the freedom of selection of the design is drastically limited and the diffraction associated with one-sided finger weighting of this kind could not be effectively compensated to an adequate extent.

Two further particularly advantageous developments of the invention will now be described. As will be explained on the basis of the description of FIG. 6, it lies within the scope of the invention that the width of the busbar of the comb structure in question should have a width up to 5 to 10% of the length dimension of the interval between the two busbars, arranged opposite one another, of the two comb structures, i.e. of the dimension of the maximum possible finger length. Thus, transversely to the main propagation direction, i.e. parallel to the fingers, at the end in question of the relevant interdigital structure, there is an apparent extension—corresponding to the width of the busbar—of the last finger or fingers.

Figure 7:
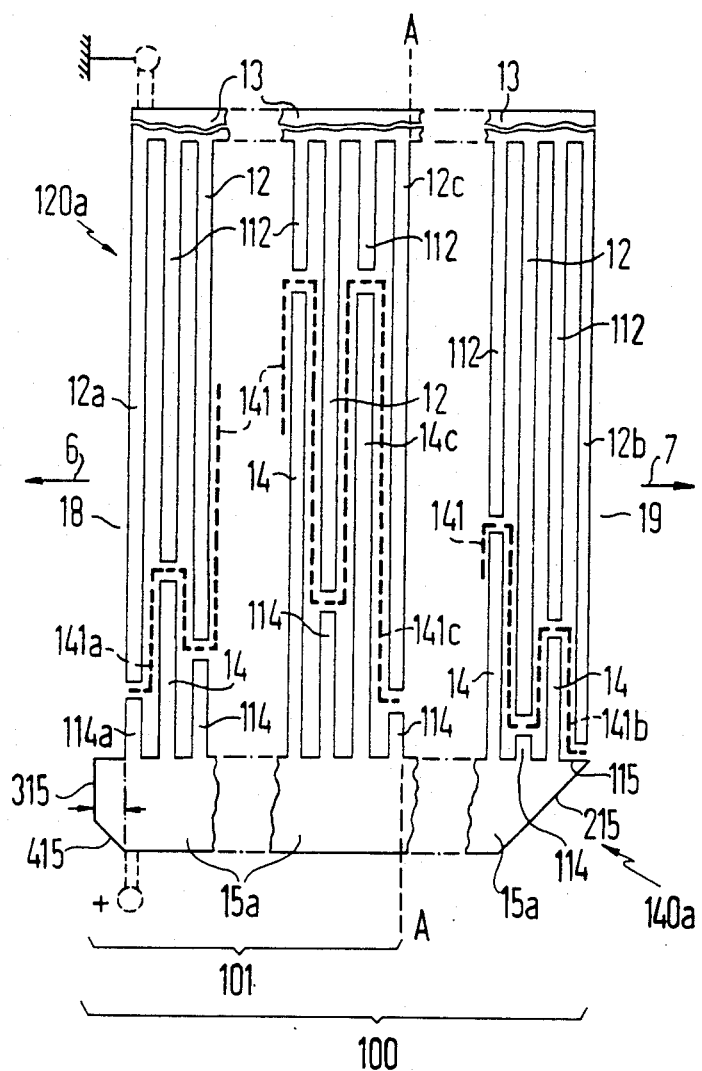
FIG. 7 shows an exemplary embodiment as shown in FIG. 6 depicting two further developments.

At one end of a known interdigital structure in accordance with FIG. 4 as described above, and at both ends of an interdigital structure in accordance with the invention and with FIGS. 5 and 6 and 7 (in each case considered in the main propagation direction 6, 7), the interdigital structure is provided with a respective last finger which has a length which is either equal to the overall distance between the two busbars 13 and 15—arranged opposite one another—(finger 12b) or is at least approximately equal or at least equal to 80% of this interval (fingers 12a, 12c). The right-hand and left-hand end edge of the busbar 15, as shown in FIG. 6, has been found to have an effect as if a further section of a finger or finger length were provided at this point connected to the high potential terminal or to the hot terminal. As a result, substantial interference can be produced, in particular if the width of the busbar 15 is substantially greater in terms of scale relative to FIG. 6, which occurs in many cases.

FIG. 7 represents the embodiment shown in FIG. 6 with an additional further development in accordance with the above principle. Like FIG. 6, FIG. 7 has comb structures 120a and 140a. On a scale based on the interval between the busbars 13 and 15, the busbar 15a has been shown as having a width which is realistic in many situations. At the left-hand, lower corner of the interdigital structure shown in FIG. 7, the width of the busbar 15a is at least equal to the length of the inactive finger 114a. The plan of the interdigital transducer represented in FIG. 6 and 7 has been selected to be such that the finger length of the inactive finger 114 and 114a is as short as possible, i.e. the component 141a of the serpentine curve comes as close as possible to the busbar 15 and 15 a. Of greater significance is the width of the busbar 15a at the right-hand, lower corner of the interdigital transducer shown in FIG. 7. Here, no actual finger length (comparable with 114a) is connected to a high potential, yet nevertheless a corresponding interference effect occurs in the main propagation direction 7.

FIG. 7 represents a bevel 215 of the right-hand end of the busbar 15a. This bevel 215 eliminates the interference effect of the perpendicular edge of the busbar 15 in FIG. 6, which would otherwise occur in the main propagation direction 7. It should be noted that the scale in the perpendicular direction of FIG. 7 is considerably distorted in comparison to the scale in the transverse direction in FIG. 7. The projection 115, represented in the horizontal direction in FIG. 7, is actually only a few $\mu$m at the angular corner of the bevel 215. This horizontal projection in relation to the right-hand last finger 14 is approximately 1% of the width of the busbar 15a. This bevel 215 has been provided with an angle relative to the horizontal which causes radiation to be deflected out of the path.

A second development has been shown at the left-hand lower corner of the interdigital transducer shown in FIG. 7. Here, as a result of an offset (compare FIG. 6) of the left-hand end edge of the busbar 15a, i.e. as a result of the position of the edge 315, a compensation effect has been achieved. The component at bevel 415 of the width of the busbar 15a, which is not required for the provided compensation, has the bevel 415 which corresponds to the bevel 215.

The offset of the end edge 315, which runs parallel to the edge of the finger 114, produces a compensation of the residual radiation effect of the finger 114a, whenever this offset amounts to $(2n-1)$ times $\frac{1}{2}$ of the wavelength $\lambda$ of the acoustic wave transmitted from the interdigital transducer where n=1, 2, 3 . . . , but is preferably n=1. The compensation is produced by interference. That component 415 of the width of the busbar 15a which is not required for this interference is, as already mentioned above, provided with a bevel.

The other references given in FIG. 7 relate to details which are identical to FIG. 6.

Although various minor changes and modifications might be proposed by those skilled in the art, it will be understood that we wish to include within the claims of the patent warranted hereon all such changes and modifications as reasonably come within our contribution to the art.

We claim as our invention:

1. An electrical filter for operation with acoustic waves, comprising:
    an interdigital transducer formed of first and second comb structures each having a busbar and a plurality of fingers extending therefrom, fingers of the first comb structure being intermeshed with and overlapping alongside fingers of the second comb structure;
    the second comb structure connecting to a relatively high potential and the first comb structure connecting to a reference potential;
    the finger overlaps defining the predetermined transformation function and wherein a serpentine curve is defined representing the weighting, said serpentine curve defining an overlap envelope running from one end of the transducer to the other and between all the overlaps defined by an active finger from the first comb structure and an adjacent active finger from the opposite second comb structure;
    inside edges of the busbars from which the fingers extend of the first and second comb structures extending parallel to one another;
    each end of the overlap envelope at the respective ends of the transducer terminating substantially closer to the second comb structure busbar connected to the high potential than to the first comb structure busbar;
    at each end of the transducer a last of the overlapping fingers being a finer of the first comb structure connected to the reference potential; and
    the last active finger of the first comb structure at at least one end extending such that its end terminates substantially at but is not in contact with the busbar of the second comb structure connected to the high potential.

2. A filter according to claim 1 wherein a length of overlap of at least one of the last fingers at one of the ends of the transducer is relatively close to zero length relative to an overall length of the last active finger connected to the first comb structure connected to the reference potential.

3. A filter according to claim 1 wherein a finger length of at least one of the last overlapping fingers is at least 80% of a maximum possible overall length of an active finger of the first comb structure.

4. A filter according to claim 1 wherein at least one end of the second comb structure busbar connected to a high potential is provided with a bevel.

5. A filter according to claim 4 wherein an angle of the bevel relative to a main propagation direction of the transducer is chosen so as to deflect radiation out of a path in the main propagation direction.

6. A filter according to claim 1 wherein an end of the busbar of the second comb structure connected to the high potential has an outer edge which projects outwardly from a line defined by an outer edge of a last inactive finger, this outer edge being spaced from the line by at least approximately $(2n-1)\times\frac{1}{2}\lambda$, where $\lambda$ is a wavelength of the acoustic wave transmitted in a main propagation direction of the transducer and n is a whole number 1, 2, 3 . . . , and wherein in a transverse direction to the main propagation direction of the wave, a length of said outer edge of the busbar is approximately equal to a length of the last inactive finger connected to the second comb structure busbar.

7. A filter according to claim 6 wherein
    a bevel is provided at said outer edge going from the outer edge to an edge of the busbar opposite an edge where the fingers connect thereto.

8. An electrical filter for operation with acoustic waves, comprising:
    an interdigital transducer formed of first and second comb structures each having a busbar and a plurality of active and dummy fingers extending therefrom, the active fingers of the first comb structure being intermeshed with active fingers of the second comb structure such that a lateral overlap occurs between adjacent active fingers;
    inside edges of the busbars from which the fingers extend of the first and second comb structures extending parallel to one another;
    the first comb structure connecting to reference potential and the second comb structure connecting to a first potential;
    active finger overlaps at the ends of the transducer being positioned substantially closer to the second comb busbar than the first;
    respective dummy fingers of one comb structure being in line with respective active fingers of the other comb structure; and
    the first comb structure connected to the reference potential having an active last finger at each end of the transducer which is the outermost active finger at each end of the transducer.

9. A filter according to claim 8 wherein the second comb structure busbar has at least one dummy finger extending at its end in line with the last active finger at one end of the transducer structure.

* * * * *